(12) United States Patent
Wang et al.

(10) Patent No.: US 11,158,609 B2
(45) Date of Patent: Oct. 26, 2021

(54) THREE-DIMENSIONAL INTEGRATED PACKAGE DEVICE FOR HIGH-VOLTAGE SILICON CARBIDE POWER MODULE

(71) Applicant: XI'AN JIAOTONG UNIVERSITY, Shaanxi (CN)

(72) Inventors: Laili Wang, Shaanxi (CN); Xiaodong Hou, Shaanxi (CN); Cheng Zhao, Shaanxi (CN); Jianpeng Wang, Shaanxi (CN); Dingkun Ma, Shaanxi (CN); Chengzi Yang, Shaanxi (CN); Xu Yang, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 0 days.

(21) Appl. No.: 16/882,301

(22) Filed: May 22, 2020

(65) Prior Publication Data
US 2020/0388595 A1 Dec. 10, 2020

(30) Foreign Application Priority Data
May 22, 2019 (CN) .......................... 201910428016.5

(51) Int. Cl.
| | | |
|---|---|---|
| H01L 23/52 | (2006.01) |
| H01L 25/07 | (2006.01) |
| H01L 23/473 | (2006.01) |
| H01L 23/50 | (2006.01) |
| H01L 23/00 | (2006.01) |
| H01L 25/16 | (2006.01) |

(52) U.S. Cl.
CPC .......... *H01L 25/071* (2013.01); *H01L 23/473* (2013.01); *H01L 23/50* (2013.01); *H01L 24/29* (2013.01); *H01L 24/32* (2013.01); *H01L 25/16* (2013.01); *H01L 2224/29239* (2013.01); *H01L 2224/32245* (2013.01); *H01L 2924/10272* (2013.01); *H01L 2924/1205* (2013.01); *H01L 2924/13091* (2013.01); *H01L 2924/14252* (2013.01); *H01L 2924/30107* (2013.01)

(58) Field of Classification Search
CPC ....... H01L 23/473; H01L 23/50; H01L 24/29; H01L 24/32; H01L 25/071; H01L 25/16
USPC ....................................................... 257/691
See application file for complete search history.

(56) References Cited

U.S. PATENT DOCUMENTS

| | | | | |
|---|---|---|---|---|
| 7,772,709 B2 * | 8/2010 | Ueda | ................. | H01L 23/49537 257/787 |
| 8,421,235 B2 * | 4/2013 | Ide | ..................... | H01L 23/4012 257/773 |

FOREIGN PATENT DOCUMENTS

| | | |
|---|---|---|
| CN | 102148169 A | 8/2011 |
| CN | 105914185 A | 8/2016 |
| CN | 108682655 A | 10/2018 |

* cited by examiner

*Primary Examiner* — Luan C Thai (57) ABSTRACT

The present invention relates to a three-dimensional integrated package device for a high-voltage silicon carbide power module, comprising a source substrate, first chip submodules, a first driving terminal, a first driving substrate, a ceramic housing, a metal substrate, a water inlet, a water outlet, second chip submodules, a second driving terminal, a second driving substrate and a drain substrate from top to bottom; and each first chip submodule is composed of a driving connection substrate, a power source metal block, a first driving gate metal post, second driving gate metal posts, a silicon carbide bare chip, an insulation structure and the like. A three-dimensional integrated half-bridge structure is adopted to greatly reduce corresponding parasitic parameters.

9 Claims, 6 Drawing Sheets

THREE-DIMENSIONAL INTEGRATED PACKAGE DEVICE FOR HIGH-VOLTAGE SILICON CARBIDE POWER MODULE

TECHNICAL FIELD

The present invention relates to the field of semiconductor manufacturing, in particular to a three-dimensional integrated device for a high-voltage silicon carbide power module.

BACKGROUND OF THE PRESENT INVENTION

Third-generation power semiconductor devices represented by silicon carbide and gallium nitride (i.e., wide-bandgap power semiconductor devices) have characteristics of fast switching, low loss, high operating temperature and the like, and have performance fat superior to the existing silicon power semiconductor devices. At present, when the wide-bandgap power semiconductor device technology gradually becomes mature, a mature package technology does not exist in the world especially for the package of high-voltage silicon carbide power devices.

The existing package devices can be classified into two types: package devices based on soldering process and package devices based on crimping process. The package devices based on soldering process is usually used in the package of medium and low voltage (650-3300 V) power devices, but rarely used in the package of high-voltage power devices. At present, the package devices based on crimping process is usually adopted to power modules for power gates.

At present, typical crimping package devices are mainly applicable to silicon power devices. The existing package technology for the high-voltage silicon carbide devices is not mature, poor in reliability and unable to bring excellent performance of the high-voltage silicon carbide power devices into full play. During practical application of power transmission and distribution systems, two separate crimping modules often need to be connected in series to form a half-bridge structure, thereby causing a problem of high parasitic parameters.

SUMMARY OF PRESENT INVENTION

The purpose of the present invention is to provide a three-dimensional integrated package device for a high-voltage silicon carbide power module in view of the above problems, for solving a problem of large parasitic parameters of the existing package device.

To achieve the above purpose, the following technical solution is adopted by the present invention:

a three-dimensional integrated package device for a high-voltage silicon carbide power module, comprising a source substrate, a housing, a metal substrate, a drain substrate and a driving layer, wherein the metal substrate is arranged in the housing; and the source substrate and the drain substrate are hermetically connected with both ends of the housing respectively.

The driving layer includes a first driving layer and a second driving layer, wherein the first driving layer and the second driving layer are of the same structure; the first driving layer includes a first driving substrate and first chip submodules; the second driving layer includes a second driving substrate and second chip submodules; the first driving substrate and the first chip submodules form a half-bridge structure; a first driving terminal is arranged on the first driving substrate; a second driving terminal is arranged on the second driving substrate; and the first driving terminal and the second driving terminal respectively penetrate through the housing and extend out of the housing.

The first chip submodules and the second chip submodules are of the same structure, wherein each first chip submodule includes a driving connection substrate, a power source metal block, a first driving gate metal post, second driving gate metal posts, a silicon carbide bare chip and an insulation structure; one end of the power source metal block is sintered with a source on the silicon carbide bare chip, and the other end of the power source metal block penetrates through the first driving substrate; one end of the first driving gate metal post is sintered with a gate on the silicon carbide bare chip, and the other end of the first driving gate metal post is sintered with the driving connection substrate; one end of each second driving gate metal post is sintered with the source on the silicon carbide bare chip, and the other ends of the second driving gate metal posts are sintered with the driving connection substrate; the insulation structure is arranged around the silicon carbide bare chip; and the driving connection substrate is sintered with the first driving substrate.

The first driving layer and the second driving layer are both arranged in the housing, wherein the first driving layer is arranged between the source substrate and the metal substrate; the other ends of the power source metal blocks in the first driving layer are further sintered with the source substrate; and drains of the silicon carbide bare chips in the first driving layer are sintered with the metal substrate.

The second driving layer is arranged between the drain substrate and the metal substrate, wherein the other ends of the power source metal blocks of the second driving layer are further sintered with the metal substrate; and the drains of the silicon carbide bare chips of the second driving layer are sintered with the drain substrate.

In one embodiment, a water cooling channel is formed inside the metal substrate, wherein the water cooling channel is connected with a water inlet and a water outlet; and the water inlet and the water outlet penetrate through the housing and extend out of the housing.

In one embodiment, decoupling capacitors are connected between the source substrate and the drain substrate.

In one embodiment, the decoupling capacitors are arranged outside the housing, wherein each decoupling capacitor includes a capacitor substrate and high-voltage capacitors arranged on the capacitor substrate; two electrodes of the high-voltage capacitors are respectively connected with the source substrate and the drain substrate; and the capacitor substrate and the high-voltage capacitors are coated in an insulating layer.

In one embodiment, a plurality of high-voltage capacitors are provided, wherein the plurality of high-voltage capacitors are connected with each other in series; and the two electrodes after the plurality of high-voltage capacitors are connected in series are respectively connected with the source substrate and the drain substrate.

In one embodiment, the first driving gate metal post and the second driving gate metal posts are all located at the same side of each power source metal block.

In one embodiment, through holes are formed in the driving connection substrates, wherein the driving connection substrates are sleeved on the power source metal blocks through the through holes; and gaps are reserved between the driving connection substrates and the power source metal blocks.

In one embodiment, the first driving gate metal posts and the second driving gate metal posts are of the same height.

In one embodiment, nano-silver sintering is used as a sintering manner.

In one embodiment, the housing is a ceramic housing.

The present invention has the following beneficial effects:

In the three-dimensional integrated package device of the high-voltage silicon carbide power module, take one first chip submodule as an example, one end of the first driving gate metal post is sintered with the gate on the silicon carbide bare chip, and the other end of the first driving gate metal post is sintered with the driving connection substrate; one end of each second driving gate metal post is sintered with the source on the silicon carbide bare chip, and the other ends of the second driving gate metal posts are sintered with the driving connection substrate; and one end of the power source metal block is sintered with the source on the silicon carbide bare chip. Since the above structure is adopted by each chip submodule of the present invention, the driving connection substrate in each chip submodule can be sintered with the corresponding driving substrate; the other end of the power source metal block in the first driving layer can be sintered with the source substrate; the drain of the silicon carbide bare chip in the first driving layer can be sintered with the metal substrate; the other end of the power source metal block in the second driving layer can be sintered with the metal substrate; and the drain of the silicon carbide bare chip in the second driving layer can be sintered with the drain substrate.

Firstly, since a sintering connection manner is adopted, the parasitic parameters of the whole three-dimensional integrated package device for the high-voltage silicon carbide power module can be reduced.

Secondly, by adopting a three-dimensional integrated half-bridge structure, circuits can be free from limitations of a two-dimensional layout; the parasitic parameters are greatly reduced in comparison with the soldering structure; and the parasitic parameters generated are equivalent in comparison with the crimping structure.

Further, since the sintering connection manner is adopted, the sintering layer has the characteristics of low-temperature sintering, high melting point and high thermal conductivity; and the whole three-dimensional integrated package device for the high-voltage silicon carbide power module has strong resistance to thermo-mechanical fatigue, thereby greatly improving the long-term reliability in harsh application environments and avoiding defects that pressure cannot be uniformly distributed and the connection reliability of components is reduced due to uneven temperature distribution in the traditional crimping module. The first chip submodules and the second chip submodules in the three-dimensional integrated package device for the high-voltage silicon carbide power module provided by the present invention are of a novel submodule structure, wherein the corresponding power source metal block, first driving metal post and second driving metal posts are arranged on each chip submodule; and the corresponding power source metal block, first driving metal post and second driving metal posts are respectively sintered with other components through respective planes thereon to ensure the mounting precision in the case of small area of each chip submodule. Meanwhile, since the first driving metal post and the second driving gate metal posts in each driving circuit are separated from the corresponding power source metal block in the power circuit respectively, the influence of source parasitic inductance in each chip submodule on the corresponding driving circuit can be reduced, i.e., Calvin connection of each driving circuit is realized, and the reliability of the corresponding driving is improved.

Further, the water cooling channel is formed in the metal substrate, so that the corresponding chip submodule in each driving layer can be guaranteed to have double-sided heat dissipation conditions.

Further, the decoupling capacitors are connected between the source substrate and the drain substrate; and the decoupling capacitors can reduce the influence of parasitic inductance of a busbar and the metal substrate on on-off of the module and reduce voltage oscillation.

Further, the decoupling capacitors are arranged outside the housing, so that the decoupling capacitors can be independent of the three-dimensional integrated package device for the high-voltage silicon carbide power module; whether the decoupling capacitors are mounted can be selected as required; and the decoupling capacitors can be replaced independently without reducing the reliability of the interior of the whole three-dimensional integrated package device for the high-voltage silicon carbide power module.

Further, the first driving gate metal post and the second driving gate metal posts are all located at the same side of each power source metal block, so that the structure of each chip submodule is more compact.

DESCRIPTION OF REFERENCE NUMERALS

In the figures, 1—source substrate, 2—first driving terminal, 3—housing, 4—second driving terminal, 5—drain substrate, 6—first driving substrate, 7—first chip submodule, 8—metal substrate, 9—water inlet, 10—water outlet, 11—second driving substrate, 12—second chip submodule, 13—decoupling capacitor, 14—insulating layer, 15—high-voltage capacitor, 16—capacitor substrate, 17—connection plug, 18—half-bridge upper switch, 19—half-bridge lower switch, 20—driving connection substrate, 21—power source metal block, 22—driving gate metal post, 23—driving gate metal post, 24—silicon carbide bare chip, 24-1—gate, 24-2—source, 24-3—drain, 25—insulation structure, 26—nano-silver sintering point, 27—driving layer, 28—first driving layer, 29—second driving layer, 30—through hole, 31—water cooling channel and 32—water cooling radiator.

DETAILED DESCRIPTION OF PREFERRED EMBODIMENTS

In order to enable those skilled in the art to better understand the technical solution of the present invention, the present invention will be described in detail below with reference to the accompanying drawings. The description here is only exemplary and explanatory, and should not have any limitation on the protection scope of the present invention.

Figure 1:
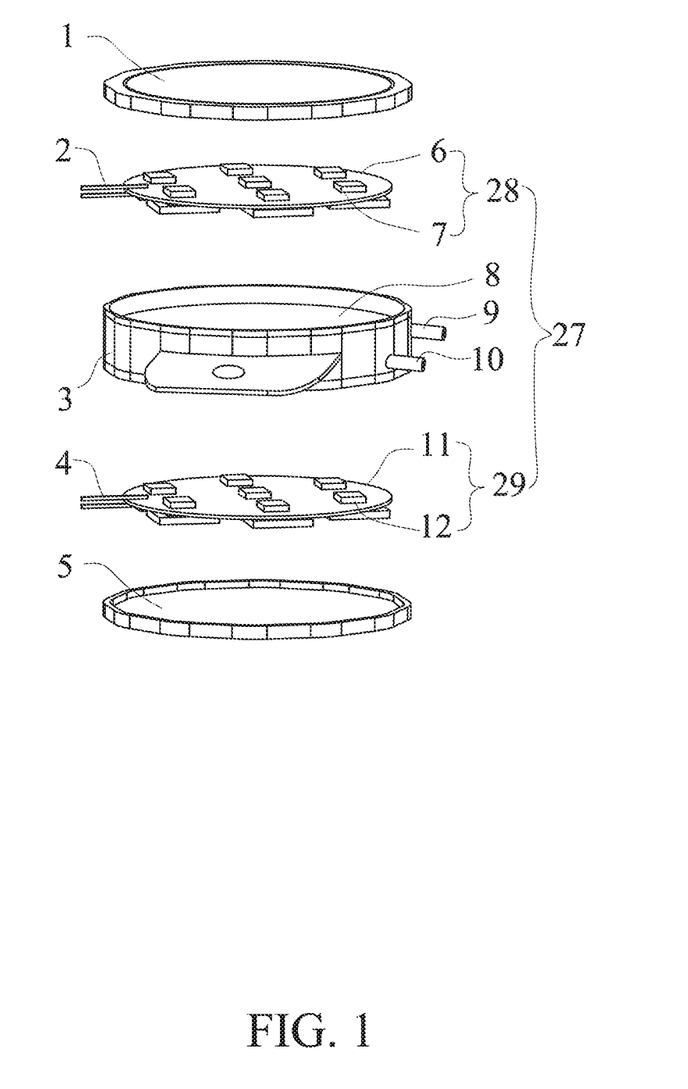
FIG. 1 is an exploded schematic diagram of a three-dimensional integrated package device for a high-voltage silicon carbide power module according to the present invention.
Figure 2:
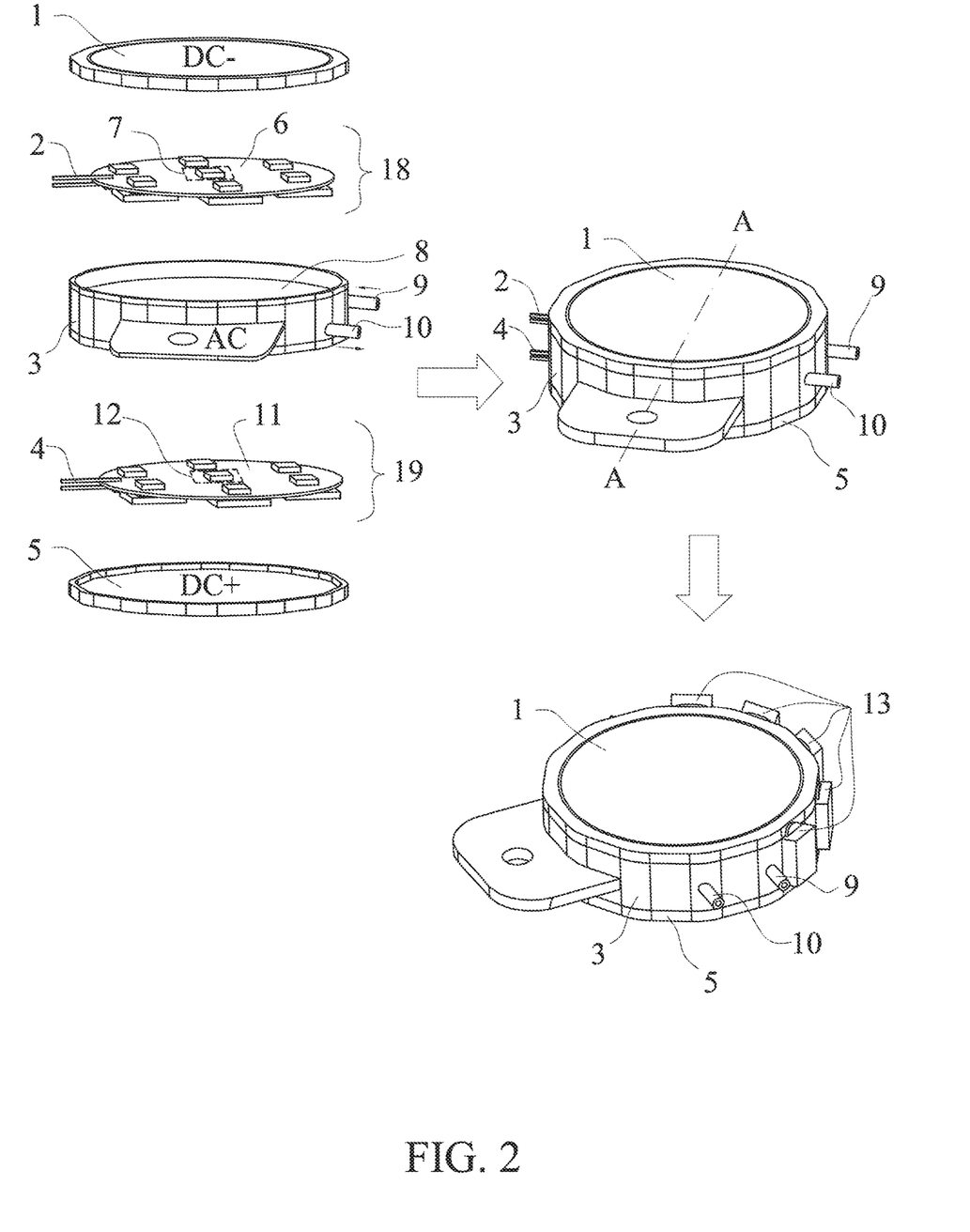
FIG. 2 is a schematic diagram of an assembly process of a three-dimensional integrated package device for a high-voltage silicon carbide power module according to the present invention.
Figure 3:
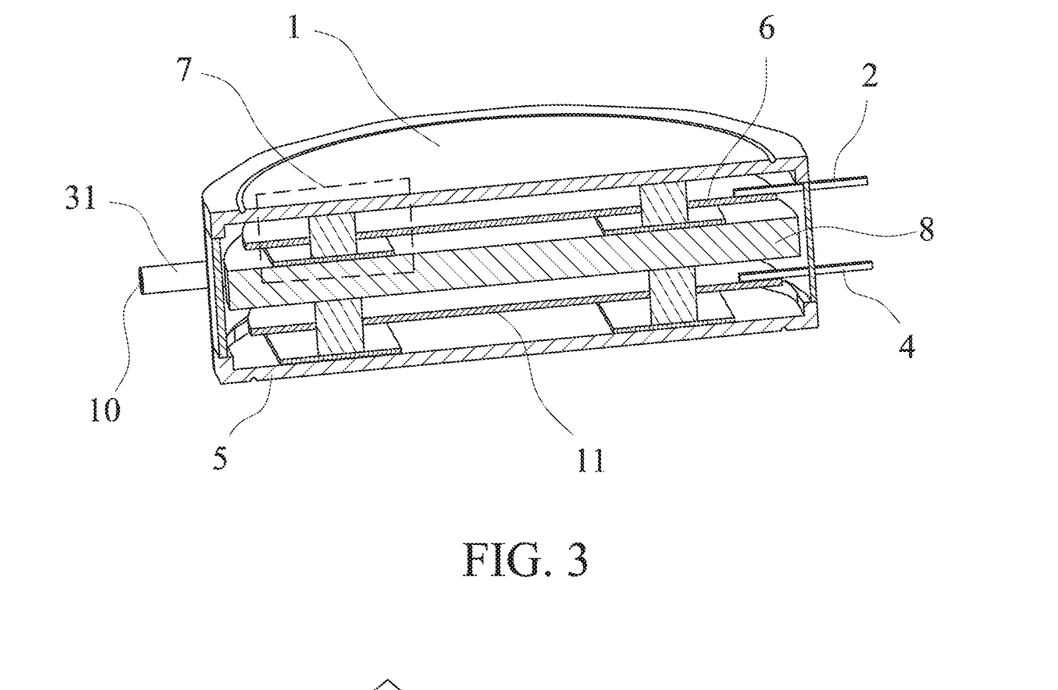
FIG. 3 is a sectional view of a cross section A-A in FIG. 2 according to the present invention.

As shown in FIGS. 1, 2 and 3, the three-dimensional integrated package device for the high-voltage silicon carbide power module provided by the present invention comprises a source substrate 1, a housing 3, metal substrate 8, a drain substrate 5 and a driving layer, wherein the metal substrate 8 is arranged in the housing 3; the source substrate 1 and the drain substrate 5 are hermetically connected with both ends of the housing 3 respectively; the driving layer 27 includes a first driving layer 28 and a second driving layer 29; the first driving layer 28 and the second driving layer 29 are of the same structure; the first driving layer 28 includes a first driving substrate 6 and first chip submodules 7; the second driving layer 29 includes a second driving substrate 11 and second chip submodules 12; the first driving substrate 6 and the first chip submodules 7 form a half-bridge structure; a first driving terminal 2 is arranged on the first driving substrate 6; a second driving terminal 4 is arranged on the second driving substrate 11; and the first driving terminal 2 and the second driving terminal 4 respectively penetrate through the housing 3 and extend out of the housing 3.

In one embodiment, with reference to FIG. 3 and FIGS. 6-8, each first chip submodule 7 includes a driving connection substrate 20, a power source metal block 21, a first driving gate metal post 22, second driving gate metal posts 23, a silicon carbide bare chip 24 and an insulation structure 25. Take azimuths shown in FIGS. 1 and 2 as an example, one end of the first driving gate metal post 22 is sintered with a gate 24-1 on the silicon carbide bare chip 24, and the other end of the first driving gate metal post 22 is sintered with the driving connection substrate 20; one end of each second driving gate metal post 23 is sintered with a source 24-2 on the silicon carbide bare chip 24, and the other ends of the second driving gate metal posts 23 are sintered with the driving connection substrate 20; one end of the power source metal block 21 is sintered with the source 24-2 on the silicon carbide bare chip 24; one end of the power source metal block 21 penetrates through the first driving substrate 6; and the insulation structure 25 is arranged around the silicon carbide bare chip 24. With reference to FIG. 3, a lower surface of the driving connection substrate 20 is sintered with an upper surface of the first driving substrate 6; the first driving layer 28 and the second driving layer 29 are both arranged in the housing 3; the first driving layer 28 is arranged between the source substrate 1 and the metal substrate 8; one end of the power source metal block 21 in the first driving layer 28 is also sintered with the source substrate 1; a drain 24-3 of the silicon carbide bare chip 24 in the first driving layer 28 is sintered with the metal substrate 8; the second driving layer 29 is arranged between the drain substrate 5 and the metal substrate 8; one end of the power source metal block 21 of the second driving layer 29 is also sintered with the metal substrate 8; and the drain 24-3 of the silicon carbide bare chip 24 of the second driving layer 29 is sintered with the drain substrate 5. The source substrate 1 and the drain substrate 5 are both metal substrates; and the metal substrates are used as leading-out terminals, so that the three-dimensional integrated package device for the high-voltage silicon carbide power module is compatible with the existing power transmission and transformation systems for power grids.

In the three-dimensional integrated package device for the high-voltage silicon carbide power module provided by the present invention, a plurality of first chip submodules 7 and second chip submodules 12 are provided. With reference to FIGS. 1-3, a drive of each first chip submodule 7 is respectively connected with the first driving substrate 6 to form the corresponding first driving layer 28; the first driving layer 28 forms a half-bridge upper switch 18; the drive of each second chip submodule 12 is respectively connected with the second driving substrate 11 to form the corresponding second driving layer 29; and the second driving layer 29 forms a half-bridge lower switch 19. The power source metal blocks 21 of all the first chip submodules 7 in the half-bridge upper switch 18 are respectively connected with the source substrate 1 of a top layer in a nano-silver sintering manner; and then the drains 24-3 of the silicon carbide bare chips 24 in all the first chip submodules 7 in the half-bridge upper switch 18 are sintered on the same metal substrate 8 to form a drain layer; the power source metal blocks 21 of all the second chip submodules 12 in the half-bridge lower switch 19 are respectively sintered on the middle metal substrate 8; the drains 24-3 of the silicon carbide bare chips 24 of all the second chip submodules 12 in the half-bridge lower switch 19 are sintered on the bottommost drain substrate 5; and finally, the housing 3 is added outside the whole three-dimensional integrated package device for the high-voltage silicon carbide power module.

Figure 5:
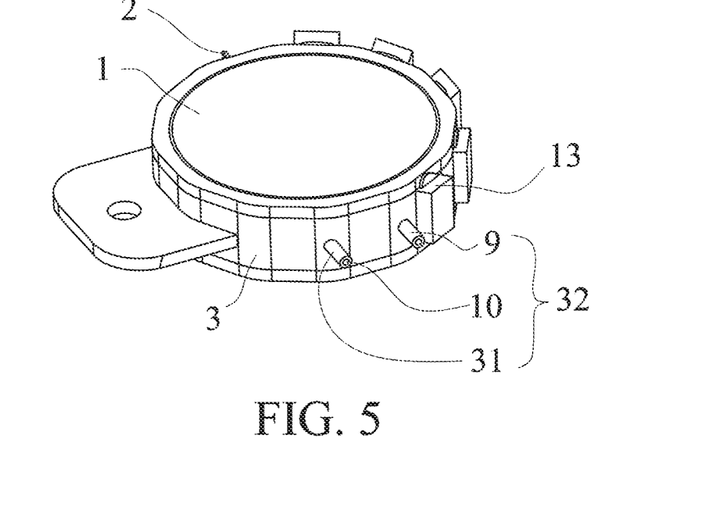
FIG. 5 is a schematic diagram of a three-dimensional integrated package device for a high-voltage silicon carbide power module according to an embodiment of the present invention.

As a preferred embodiment of the present invention, as shown in FIGS. 3 and 5, the metal substrate 8 can be integrated with a water cooling radiator 32, wherein the water cooling radiator 32 includes a water cooling channel 31, a water inlet 9 and a water outlet 10; the water cooling channel 31 is formed inside the metal substrate 8; the water cooling channel 31 is connected with the water inlet 9 and the water outlet 10; and the water inlet 9 and the water outlet 10 penetrate through the housing 3 and extend out of the housing 3.

As shown in FIGS. 2 and 5, as a preferred embodiment of the present invention, the three-dimensional integrated package device for the high-voltage silicon carbide power module provided by the present invention can be externally connected with decoupling capacitors 13 as required, wherein the decoupling capacitors 13 are respectively connected with the source substrate 1 and the drain substrate 5 through jacks in the metal substrate 8; and the decoupling capacitors 13 can be reinforced by screws if necessary. Thus, on the premise of ensuring that the reliability of the interior of the whole three-dimensional integrated package device for the high-voltage silicon carbide power module is not affected, the influence of parasitic inductance of the water cooling radiator 32 on on-off of the whole three-dimensional integrated package device for the high-voltage silicon carbide power module is also reduced.

Figure 4:
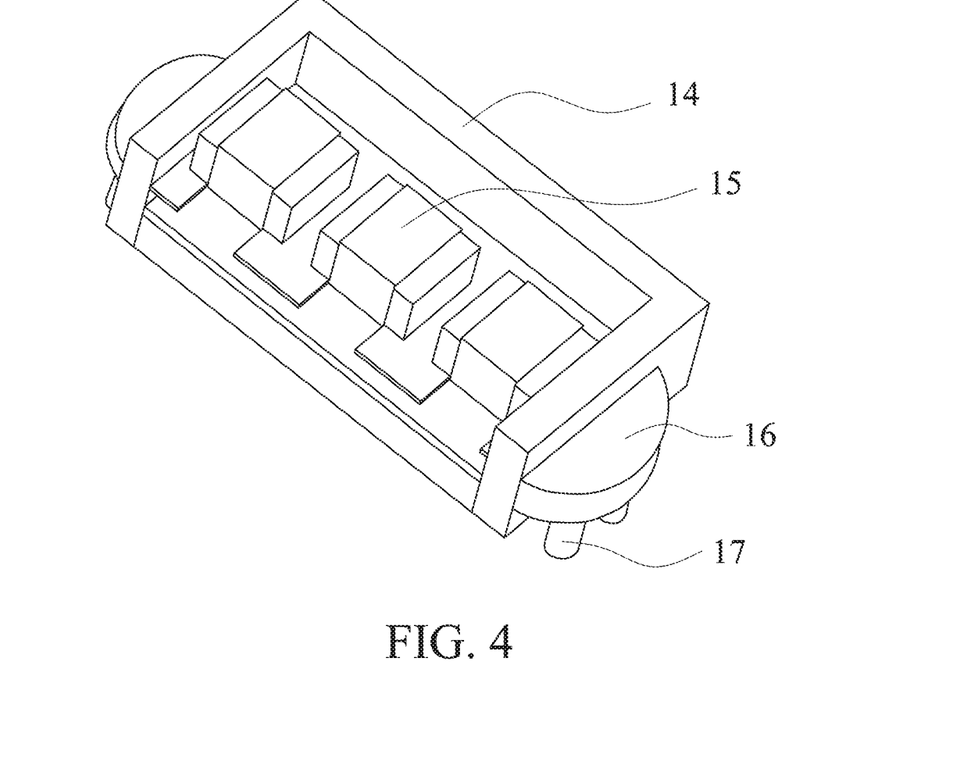
FIG. 4 is a structural schematic diagram of a decoupling capacitor in a three-dimensional integrated package device for a high-voltage silicon carbide power module according to the present invention.

As shown in FIGS. 4 and 5, as a preferred embodiment of the present invention, the decoupling capacitors 13 are arranged outside the housing 3; a plurality of decoupling capacitors 13 can be connected outside the housing 3 as required; each decoupling capacitor 13 includes a capacitor substrate 16 and high-voltage capacitors 15 arranged on the capacitor substrate 16; two electrodes of the high-voltage capacitors 15 are respectively connected with the source substrate 1 and the drain substrate 5; the capacitor substrate 16 and the high-voltage capacitors 15 are coated in an insulating layer 14, wherein the insulating layer 14 guarantees the insulation level of each decoupling capacitor 13 in high-voltage application; and a connection plug 17 able to be connected with the source substrate 1 and the drain substrate 5 is arranaed on the capacitor substrate 16.

As shown in FIG. 4, as a preferred embodiment of the present invention, a plurality of high-voltage capacitors 15 are arranged in each decoupling capacitor 13, wherein the plurality of high-voltage capacitors 15 are connected with each other in series; and the two electrodes after the plurality of high-voltage capacitors 15 are connected in series are respectively connected with the source substrate 1 and the drain substrate 5.

Figure 6:
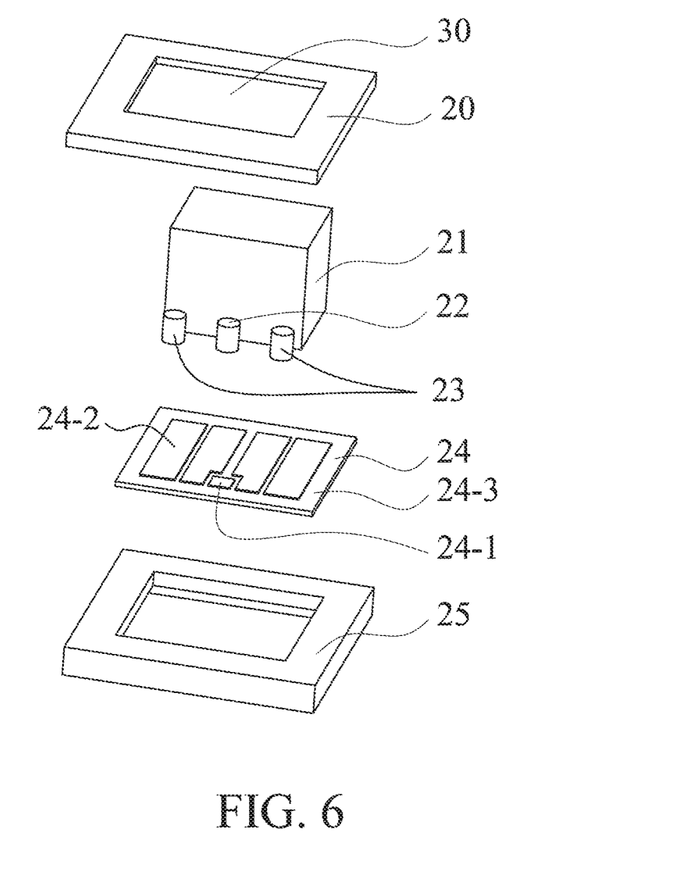
FIG. 6 is a structural schematic diagram of a chip submodule of a three-dimensional integrated package device for a high-voltage silicon carbide power module according to one embodiment of the present invention.
Figure 7:
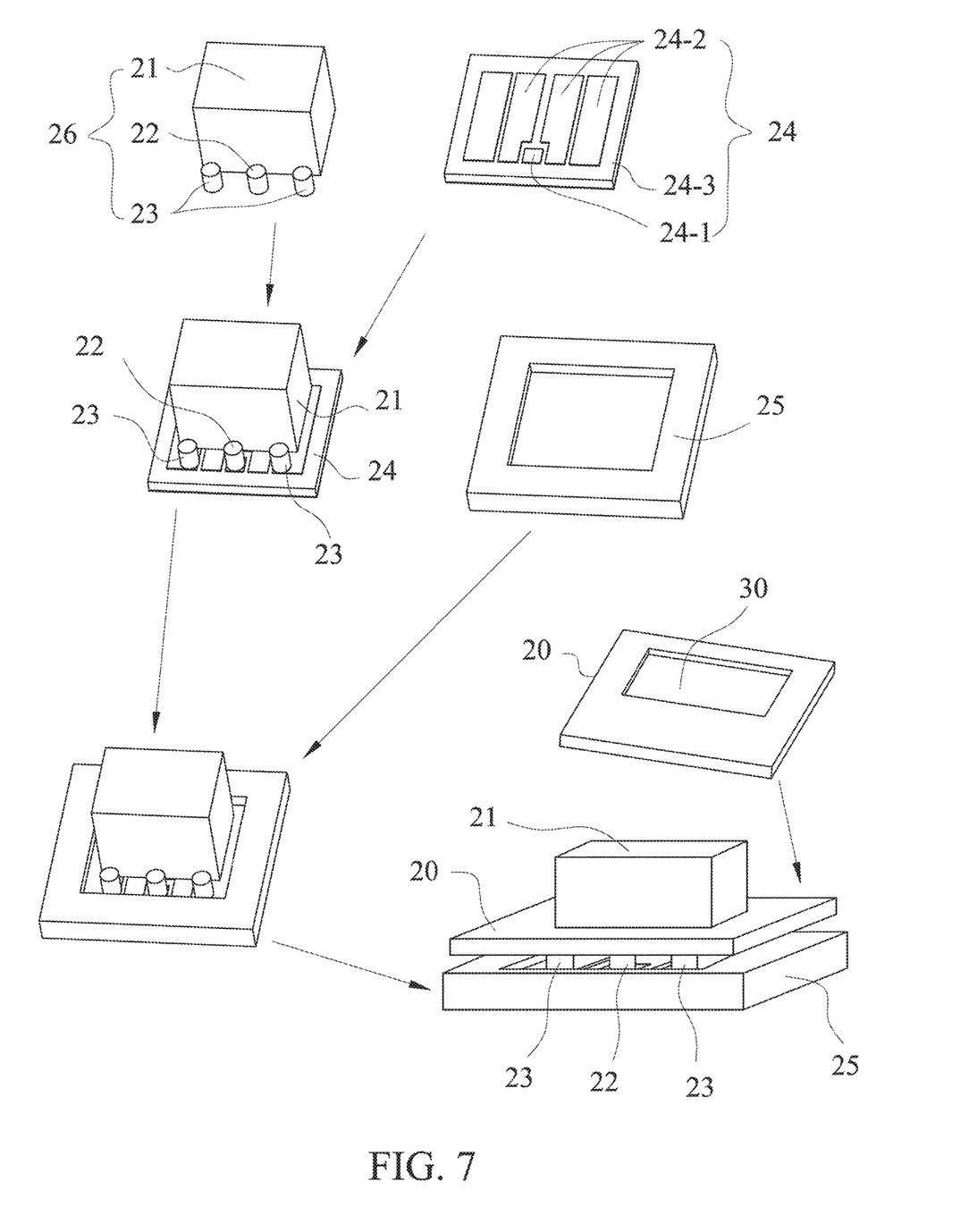
FIG. 7 is a schematic diagram of an assembly process of a chip submodule of a three-dimensional integrated package device for a high-voltage silicon carbide power module according to one embodiment of the present invention.
Figure 8:
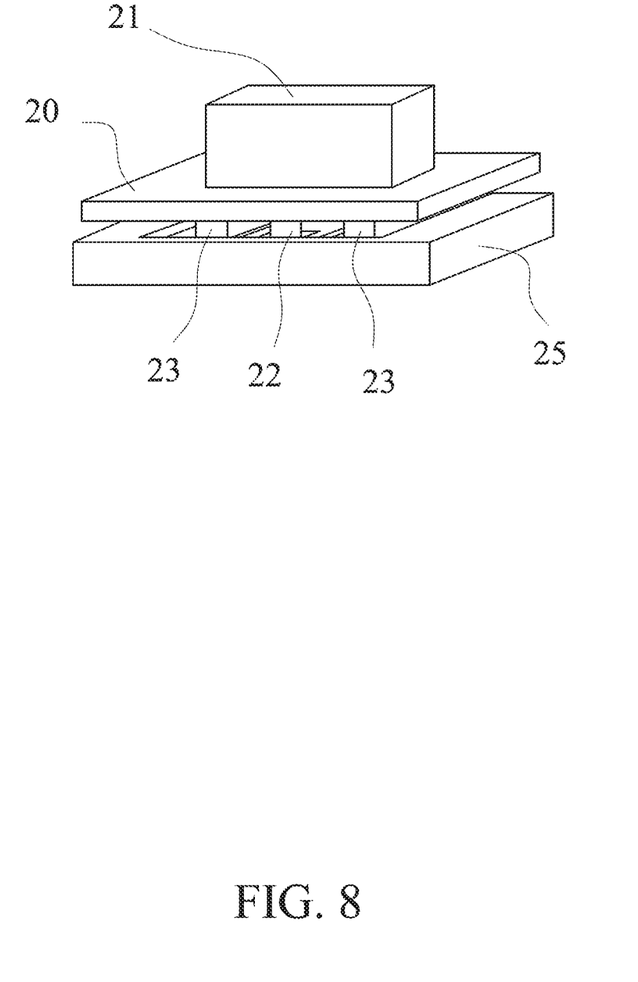
FIG. 8 is a structural schematic diagram of a chip submodule of a three-dimensional integrated package device for a high-voltage silicon carbide power module according to another embodiment of the present invention.

With reference to FIGS. 6-8, in the present invention, in the same chip submodule, take one first chip submodule 7 as an example, the first driving gate metal post 22 and the second driving gate metal posts 23 are all located at the same side of the power source metal block 21. A through hole 30 is formed in the driving connection substrate 20; the driving connection substrate 20 is sleeved on the power source metal block 21 through the through hole 30; and a gap is reserved between the driving connection substrate 20 and the power source metal block 21. The first driving gate metal post 22 and the second driving gate metal posts 23 are of the same height. Nano-silver sintering is used as a sintering manner. The housing 3 is a ceramic housing.

A three-dimensional integrated half-bridge structure is adopted in the three-dimensional integrated package device for the high-voltage silicon carbide power module provided by the present invention, wherein the water cooling radiator 32 can be selectively integrated on the middle metal substrate 8 according to the power level and heat dissipation requirements; and on this basis, it is proposed that a plurality of decoupling capacitors 13 independent of the whole three-dimensional integrated package device for the high-voltage silicon carbide power module are externally connected. A nano-silver sintering plane interconnection process is adopted in the present invention to reduce corresponding parasitic parameters of the whole three-dimensional integrated package device for the high-voltage silicon carbide power module; meanwhile, the nano-silver sintering layer has the characteristics of low-temperature sintering, high melting point and high thermal conductivity, and has strong resistance to thermo-mechanical fatigue, thereby greatly improving the long-term reliability of the three-dimensional integrated package device for the high-voltage silicon carbide power module in harsh application environments, and avoiding defects that pressure cannot be uniformly distributed and the connection reliability of components is reduced due to uneven temperature distribution in the traditional crimping module. According to the three-dimensional integrated package device for the high-voltage silicon carbide power module provided by the present invention, the insulation structure 25 made of high-insulation strength materials is added to a terminal of each chip submodule to ensure the voltage endurance capability of each chip submodule.

Compared with the prior art, the three-dimensional integrated package device for the high-voltage silicon carbide power module provided by the present invention has the advantages as follows.

1. By adopting the three-dimensional integrated half-bridge structure, circuits can be free from limitations of a two-dimensional layout; the parasitic parameters are greatly reduced in comparison with the soldering structure; and the parasitic parameters generated are equivalent in comparison with the crimping structure.

2. The water cooling radiator 32 can be selectively integrated on the middle metal substrate 8 according to the power level and heat dissipation requirements to ensure that the corresponding chip submodule in each driving layer has double-sided heat dissipation conditions.

3. A plurality of decoupling capacitors 13 are mounted on the sides of the source substrate 1 and the drain substrate 5, to not only reduce the influence of parasitic inductance generated by the busbar and the metal substrate 8 on the on-off of the three-dimensional integrated package device for the high-voltage silicon carbide power module and reduce voltage oscillation, but also enable the decoupling capacitors 13 to be independent of the three-dimensional integrated package device for the high-voltage silicon carbide power module; whether the decoupling capacitors are mounted can be selected as required; and the decoupling capacitor can also be replaced independently without reducing the reliability of the interior of the whole three-dimensional integrated package device for the high-voltage silicon carbide power module.

4. The three-dimensional integrated package device for the high-voltage silicon carbide power module is mainly applied to high-voltage power grids, and is compatible with the existing power transmission and transformation systems of the high-voltage power grids.

We claim:

1. A three-dimensional integrated package device for a high-voltage silicon carbide power module, comprising a source substrate (1), a housing (3), a metal substrate (8), a drain substrate (5) and a driving layer (27), wherein the metal substrate (8) is arranged in the housing (3); and the source substrate (1) and the drain substrate (5) are hermetically connected with both ends of the housing (3) respectively;

the driving layer (27) comprises a first driving layer (28) and a second driving layer (29); the first driving layer (28) and the second driving layer (29) are of the same structure; the first driving layer (28) comprises a first driving substrate (6) and first chip submodules (7); the second driving layer (29) comprises a second driving substrate (11) and second chip submodules (12); the first driving substrate (6) and the first chip submodules (7) form a half-bridge structure; a first driving terminal (2) is arranged on the first driving substrate (6); a second driving terminal (4) is arranged on the second driving substrate (11); and the first driving terminal (2) and the second driving terminal (4) respectively penetrate through the housing (3) and extend out of the housing (3);

the first chip submodules (7) and the second chip submodules (12) are of the same structure; each first chip submodule (7) comprises a driving connection substrate (20), a power source metal block (21), a first driving gate metal post (22), second driving gate metal posts (23), a silicon carbide bare chip (24) and an insulation structure (25); one end of the power source metal block (21) is sintered with a source (24-2) on the silicon carbide bare chip (24), and the other end of the power source metal block (21) penetrates through the first driving substrate (6); one end of the first driving gate metal post (22) is sintered with a gate (24-1) on the silicon carbide bare chip (24), and the other end of the first driving gate metal post (22) is sintered with the driving connection substrate (20); one end of each second driving gate metal post (23) is sintered with the source (24-2) on the silicon carbide bare chip (24), and the other ends of the second driving gate metal posts (23) are sintered with the driving connection substrate (20); the insulation structure (25) is arranged around the silicon carbide bare chip (24); and the driving connection substrate (20) is sintered with the first driving substrate (6);

the first driving layer (28) and the second driving layer (29) are both arranged in the housing (3); the first driving layer (28) is arranged between the source substrate (1) and the metal substrate (8); the other ends of the power source metal blocks (21) in the first driving layer (28) are further sintered with the source substrate (1); and drains (24-3) of the silicon carbide bare chips (24) in the first driving layer (28) are sintered with the metal substrate (8);

the second driving layer (29) is arranged between the drain substrate (5) and the metal substrate (8); the other ends of the power source metal blocks (21) of the second driving layer (29) are further sintered with the metal substrate (8); and the drains (24-3) of the silicon carbide bare chips (24) of the second driving layer (29) are sintered with the drain substrate (5).

2. The three-dimensional integrated package device for the high-voltage silicon carbide power module according to claim 1, wherein a water cooling channel (31) is formed inside the metal substrate (8); the water cooling channel is connected with a water inlet (9) and a water outlet (10); and the water inlet (9) and the water outlet (10) penetrate through the housing (3) and extend out of the housing (3).

3. The three-dimensional integrated package device for the high-voltage silicon carbide power module according to claim 1, wherein decoupling capacitors (13) are connected between the source substrate (1) and the drain substrate (5).

4. The three-dimensional integrated package device for the high-voltage silicon carbide power module according to claim 3, wherein the decoupling capacitors (13) are arranged outside the housing (3); each decoupling capacitor (13) comprises a capacitor substrate (16) and high-voltage capacitors (15) arranged on the capacitor substrate (16); two electrodes of the high-voltage capacitors (15) are respectively connected with the source substrate (1) and the drain substrate (5); and the capacitor substrate (16) and the high-voltage capacitors (15) are coated in an insulating layer (14).

5. The three-dimensional integrated package device for the high-voltage silicon carbide power module according to claim 4, wherein a plurality of high-voltage capacitors (15) are provided; the plurality of high-voltage capacitors (15) are connected with each other in series; and the two electrodes after the plurality of high-voltage capacitors (15) are connected in series are respectively connected with the source substrate (1) and the drain substrate (5).

6. The three-dimensional integrated package device for the high-voltage silicon carbide power module according to claim 1, wherein the first driving gate metal post (22) and the second driving gate metal posts (23) are all located at the same side of each power source metal block (21).

7. The three-dimensional integrated package device for the high-voltage silicon carbide power module according to claim 1, wherein through holes (30) are formed in the driving connection substrates (20); the driving connection substrates (20) are sleeved on the power source metal blocks (21) through the through holes (30); and gaps are reserved between the driving connection substrates (20) and the power source metal blocks (21).

8. The three-dimensional integrated package device for the high-voltage silicon carbide power module according to claim 1, wherein the first driving gate metal posts (22) and the second driving gate metal posts (23) are of the same height.

9. The three-dimensional integrated package device for the high-voltage silicon carbide power module according to claim 1, wherein nano-silver sintering is used as a sintering manner.

* * * * *